United States Patent
Yamamoto et al.

(10) Patent No.: US 9,787,222 B2
(45) Date of Patent: Oct. 10, 2017

(54) ELECTROSTATIC ATTRACTION APPARATUS, ELECTROSTATIC CHUCK AND COOLING TREATMENT APPARATUS

(71) Applicant: Tokyo Electron Limited, Tokyo (JP)

(72) Inventors: Kaoru Yamamoto, Nirasaki (JP); Shinji Orimoto, Nirasaki (JP); Naoyuki Suzuki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 331 days.

(21) Appl. No.: 14/721,408

(22) Filed: May 26, 2015

(65) Prior Publication Data

US 2015/0349668 A1 Dec. 3, 2015

(30) Foreign Application Priority Data

May 29, 2014 (JP) .................................. 2014-111285

(51) Int. Cl.
*H02N 13/00* (2006.01)
*H01L 21/683* (2006.01)
*H01L 21/687* (2006.01)

(52) U.S. Cl.
CPC ......... *H02N 13/00* (2013.01); *H01L 21/6833* (2013.01); *H01L 21/6875* (2013.01); *H01L 21/68742* (2013.01)

(58) Field of Classification Search
CPC ............... H02N 13/00; H01L 21/6833; H01L 21/68742; H01L 21/6875
See application file for complete search history.

(56) References Cited

U.S. PATENT DOCUMENTS

| | | | | |
|---|---|---|---|---|
| 5,275,683 A | * | 1/1994 | Arami | H01L 21/6831 156/345.51 |
| 5,348,497 A | * | 9/1994 | Nitescu | H01J 37/32577 411/373 |
| 5,350,479 A | * | 9/1994 | Collins | H01L 21/6831 156/345.53 |
| 5,625,526 A | | 4/1997 | Watanabe et al. | |

(Continued)

FOREIGN PATENT DOCUMENTS

| | | |
|---|---|---|
| JP | 07-161803 A | 6/1995 |
| JP | 08-330405 A | 12/1996 |
| JP | 2005-057234 A | 3/2005 |

(Continued)

*Primary Examiner* — Zeev V Kitov
(74) *Attorney, Agent, or Firm* — Abelman, Frayne & Schwab

(57) ABSTRACT

Provided is an electrostatic attraction apparatus in which a first insulating layer is formed on a base in an electrostatic chuck. A first portion of the first insulating layer extends on a first face of the base and a second portion of the first insulating layer extends on at least a portion of a second face of the base. An attraction electrode is formed on the first portion of the first insulating layer. A second insulating layer is formed on the first portion of the first insulating layer and the attraction electrode. A conductor pattern extends from the attraction electrode and provides a power supply terminal on the second portion of the first insulating layer. A contact part of a terminal member urged by an urging unit is in contact with the power supply terminal. The terminal member is connected with a wiring line connected to a supply power.

8 Claims, 7 Drawing Sheets

(56) References Cited

U.S. PATENT DOCUMENTS 5,822,171 A * 10/1998 Shamouilian ..... C23C 16/45521
279/128

FOREIGN PATENT DOCUMENTS

| JP | 2007-073363 A | 3/2007 |
|---|---|---|
| JP | 2012-142413 A | 7/2012 |
| KR | 10-2008-0088757 A | 10/2008 |

* cited by examiner

ELECTROSTATIC ATTRACTION APPARATUS, ELECTROSTATIC CHUCK AND COOLING TREATMENT APPARATUS

CROSS-REFERENCE TO RELATED APPLICATIONS

This application is based on and claims priority from Japanese Patent Application No. 2014-111285, filed on May 29, 2014, with the Japan Patent Office, the disclosure of which is incorporated herein in its entirety by reference.

TECHNICAL FIELD

Exemplary embodiments of the present disclosure are related to an electrostatic attraction apparatus, an electrostatic chuck, and a cooling treatment apparatus.

BACKGROUND

Various processing are performed on a processing target object accommodated in a processing container of a processing apparatus in manufacturing an electric device. The processing apparatus generally includes a mechanism for holding the processing target object accommodated in the processing container. An electrostatic attraction apparatus including an electrostatic chuck is known as one type of the mechanism. The electrostatic attraction apparatus attracts and holds the processing target object on the electrostatic chuck according to an electrostatic force.

The electrostatic chuck generally includes a base, a first insulating layer, an attraction electrode, and a second insulating layer. The base is generally made of a metal and has a flat upper surface. The first insulating layer is formed on the upper surface of the base. The attraction electrode is formed on the upper surface of the base through the first insulating layer. Further, the second insulating layer is formed to cover the first insulating layer and the attraction electrode. A hole connected to a power supplying terminal of the attraction electrode is formed in the base and the first insulating layer. A wiring line passes through the hole. The wiring line is joined to the power supplying terminal. Further, an insulating member interposed between the wiring line and the base is formed around the wiring line and an adhesive or a vacuum seal is formed between the insulating member and the base. The electrostatic attraction apparatus including the electrostatic chuck is described in, for example, Japanese Laid-Open Patent Publication No. 2012-122413 and Japanese Laid-Open Patent Publication No. 2005-57234.

SUMMARY

According to one aspect of the present disclosure, there is provided an electrostatic attraction apparatus. The electrostatic attraction apparatus includes an electrostatic chuck, a terminal member, a unit which urges (hereinafter, referred to as "urging unit"), a wiring line, and a power supply. The electrostatic chuck includes a base, a first insulating layer, an attraction electrode, a second insulating layer, and a conductor pattern. The base includes a first face and a second face different from the first face. The first insulating layer is formed on the base. The first insulating layer includes a first portion extending on the first face of the base and a second portion extending on at least a portion of the second face. The attraction electrode is formed on the first portion of the first insulating layer. The second insulating layer is formed on the first portion of the first insulating layer and the attraction electrode. The conductor pattern is formed on the first insulating layer and electrically connected to the attraction electrode. The conductor pattern includes a power supplying terminal formed on the second portion of the first insulating layer. The terminal member includes a contact part which is in contact with the power supplying terminal. The urging unit urges the contact part of the terminal member to the power supplying terminal of the electrostatic chuck. The wiring line is electrically connected to the terminal member. In an embodiment, the wiring line may be electrically connected to the terminal member through the urging unit. The power supply is electrically connected to the wiring line.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
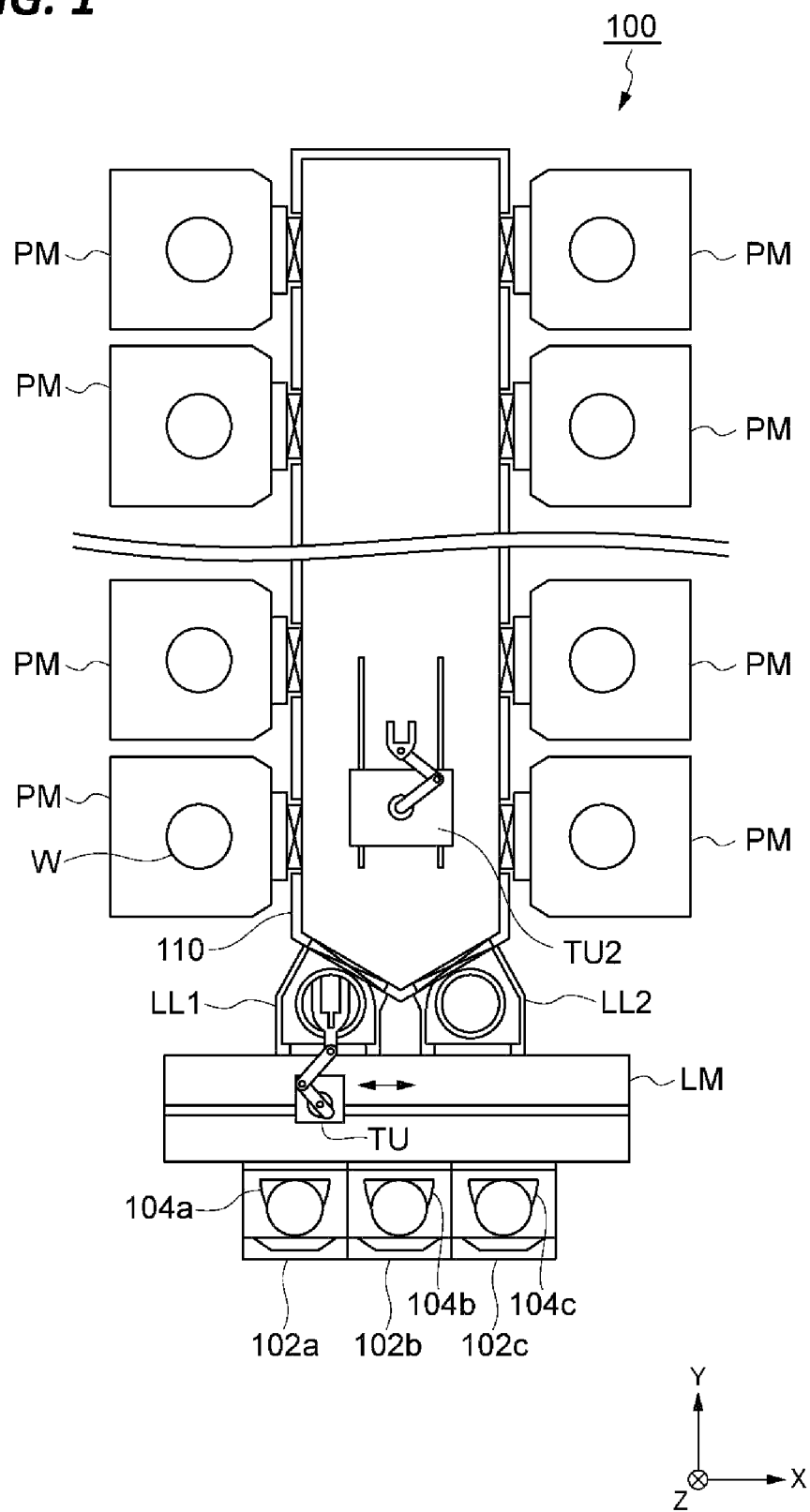
FIG. 1 is a view schematically illustrating a processing system according to an exemplary embodiment.

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

A process of cooling a processing target object may be performed as a type of a processing on the processing target object. Further, the processing target object may be cooled down to an extremely low temperature of, for example, −60 degrees or less. Therefore, it may be considered that the processing apparatus is equipped with a refrigerator for cooling the electrostatic chuck. In the processing apparatus equipped with the refrigerator, when the electrostatic chuck is cooled in order to cool the processing target object to the extremely low temperature, the adhesive and the vacuum seal may be embrittled. Due to this factor, in the processing apparatus in which the processing target object is cooled to the extremely low temperature, a reliability of a portion related to a connection between the power supplying terminal of the attraction electrode and the wiring line may not be secured. Thus, there is a risk that a conventional electrostatic attraction apparatus may not be utilized.

Therefore, it is necessary to secure reliability in the connection between the power supplying terminal of the electrostatic chuck and the wiring line even in an extremely low temperature environment.

According to one aspect, there is provided an electrostatic attraction apparatus. The electrostatic attraction apparatus includes an electrostatic chuck, a terminal member, an urging unit, a wiring line, and a power supply. The electrostatic chuck includes a base, a first insulating layer, an attraction electrode, a second insulating layer, and a conductor pattern. The base includes a first face and a second face different from the first face. The first insulating layer is formed on the base. The first insulating layer includes a first portion extending on the first face of the base and a second portion extending on at least a portion of the second face. The attraction electrode is formed on the first portion of the first insulating layer. The second insulating layer is formed on the first portion of the first insulating layer and the attraction electrode. The conductor pattern is formed on the first insulating layer and electrically connected to the attraction electrode. The conductor pattern includes a power supplying terminal formed on the second portion of the first insulating layer. The terminal member includes a contact part which is in contact with the power supplying terminal. The urging unit urges the contact part of the terminal member to the power supplying terminal of the electrostatic chuck. The wiring line is electrically connected to the terminal member. In an embodiment, the wiring line may be electrically connected to the terminal member through the urging unit. The power supply is electrically connected to the wiring line.

In the electrostatic attraction apparatus according to the one aspect, the contact part of the terminal member is in contact with the power supplying terminal and the contact part of the terminal member is urged to the power supplying terminal by the urging unit. Accordingly, in the electrostatic attraction apparatus, the electrical connection between the power supplying terminal and the wiring line may be secured without requiring an adhesive and a vacuum seal for a portion related to the electrical connection between the power supplying terminal and the wiring line. Accordingly, the reliability in the connection between the power supplying terminal and the wiring line may be secured even in an extremely low temperature environment. Further, in the electrostatic attraction apparatus, the power supplying terminal is formed on the second portion of the first insulating layer formed on the second face of the base. Accordingly, destruction of the electrostatic chuck due to pressurization by the urging unit may be prevented.

In an exemplary embodiment, the urging unit is a screw and the electrostatic attraction apparatus may further include an insulating support member which supports the screw. According to the exemplary embodiment, the urging unit may be implemented with a simple configuration and may secure insulation between the screw and the base.

In an exemplary embodiment, the contact part may include a conductive spring. According to the exemplary embodiment, reliability in a physical contact between the contact part of the terminal member and the power supplying terminal is further improved.

In an exemplary embodiment, the second face of the base may include a region extending in a direction non-parallel to the first face and the power supplying terminal may be formed on the region of the second face through the second portion of the first insulating layer. For example, the region of the second face may constitute a side surface of the base.

In an exemplary embodiment, the electrostatic attraction apparatus may attract and hold the processing target object at temperatures ranging from −263° C. to −60° C. The lower limit value of the temperature in the range is a temperature value obtained by adding temperature increment in the processing target object to the lower limit cooling temperature of an exemplary refrigerator itself. Further, the upper limit value of the temperature in the range is a temperature lower than the lower limit temperature capable of being implemented using a general refrigerant such as GALDEN (registered trademark). When an adhesive and a vacuum seal are utilized at a portion cooled to a temperature equal to or less than the upper limit value temperature, the adhesive and the vacuum seal may be embrittled.

According to another aspect, there is provided an electrostatic chuck. The electrostatic chuck includes a base, a first insulating layer, an attraction electrode, a second insulating layer, and a conductor pattern. The base includes a first face and a second face different from the first face. The first insulating layer is formed on the base. The first insulating layer includes a first portion extending on the first face and a second portion extending on at least a portion of the second face. The attraction electrode is formed on the first portion of the first insulating layer. The second insulating layer is formed on the first portion of the first insulating layer and the attraction electrode. The conductor pattern is formed on the first insulating layer and electrically connected to the attraction electrode. The conductor pattern includes a power supplying terminal formed on the second portion of the first insulating layer.

According to still another aspect, there is provided a cooling treatment apparatus. The cooling treatment apparatus includes a processing container, an electrostatic attraction apparatus, and a refrigerator. The electrostatic attraction apparatus corresponds to one of the electrostatic attraction apparatuses described in an aspect or various exemplary embodiments described above. The electrostatic chuck of the electrostatic attraction apparatus is provided within the processing container. The refrigerator is configured to cool the electrostatic chuck. The cooling treatment apparatus is able to cool the processing target object to the extremely low temperature while securing reliability in a connection between the power supplying terminal of the attraction electrode and the wiring line.

As described above, the connection reliability between the power supplying terminal of the attraction electrode and the wiring line may be secured even in an extremely low temperature environment.

Hereinafter, descriptions will be made on various exemplary embodiments in detail with reference to the accompanying drawings. Further, the same or similar constitutional elements in respective drawings will be assigned the same reference numerals.

First, a processing system according to an exemplary embodiment will be described. FIG. 1 is a view schematically illustrating a processing system according to an exemplary embodiment. A processing system 100 illustrated in FIG. 1 is a system for processing a processing target object (hereinafter, referred to as a "wafer W"). The processing system 100 includes mounting tables 102a, 102b, and 102c, accommodating containers 104a, 104b, and 104c, a loader module LM, a load-lock chamber LL1 and a load-lock chamber LL2, a plurality of process modules PM, and a transfer chamber 110.

The mounting tables 102a, 102b, and 102c are provided along the loader module LM. In the illustrated exemplary embodiment, the mounting tables 102a, 102b, and 102c are arranged along one edge of the loader module LM, that is, in the X direction along one edge in the Y direction. The accommodating containers 104a, 104b, and 104c are mounted on the mounting tables 102a, 102b, and 102c, respectively. Each of the accommodating containers 104a, 104b, and 104c accommodates a wafer W.

In the exemplary embodiment, the loader module LM has substantially a box shape in which a length in the X direction is longer than that in the Y direction. The loader module LM is provided with a chamber wall and a transfer space in an atmospheric pressure state is provided within the chamber wall. The loader module LM includes a transfer unit TU in the transfer space. The transfer unit TU of the loader module LM takes out the wafer W from an accommodating container selected from the accommodating containers 104a, 104b, and 104c and transfers the taken out wafer W into one of the load-lock chamber LL1 and the load-lock chamber LL2.

The load-lock chamber LL1 and the load-lock chamber LL2 are arranged in the X direction along the other edge in the Y direction of the loader module LM. Further, the transfer chamber 110 is provided on the other side of the Y direction of the loader module LM. As illustrated in FIG. 1, the load-lock chambers LL1 and LL2 are provided between the loader module LM and the transfer chamber 110. Gate valves are provided between the load-lock chamber LL1 and the loader module LM, between the load-lock chamber LL1 and the transfer chamber 110, between the load-lock chamber LL2 and the loader module LM, and between the load-lock chamber LL2 and the transfer chamber 110, respectively.

The load-lock chamber LL1 and the load-lock chamber LL2 provide a preliminary depressurization chamber. The wafer W is transferred to the load-lock chamber LL1 or LL2 and put under an environment depressurized from the atmospheric pressure environment before being transferred to the transfer chamber 110.

The transfer chamber 110 provides a depressurizable transfer space (transfer space). The transfer space extends in the Y direction in the embodiment. The transfer chamber 110 includes a transfer unit TU2 within the transfer space. The transfer unit TU2 moves the wafer W in the Y direction within the transfer space. Further, the transfer unit TU2 transfers the wafer W in any one of the plurality of process modules PMs. The gate valve is provided between the transfer chamber 110 and each of the plurality of process modules PM.

In the exemplary embodiment illustrated in FIG. 1, some of the process modules PM are arranged in the Y direction along one edge in the X direction of the transfer chamber 110. Further, the other process modules PM are arranged in the Y direction along the other edge in the X direction of the transfer chamber 110. Each of a plurality of process modules PM processes the wafer W having accommodated therein. For example, each of the plurality of process modules PM performs a process dedicated thereto among various processes such as, for example, a physical vapor deposition process, a pre-processing cleaning, a heating process, and a cooling process.

In the processing system 100 of the exemplary embodiment illustrated in FIG. 1, a wafer W accommodated in any one of the accommodating containers 104a, 104b, and 104c is transferred into any one of the plurality of process modules PMs through the loader module LM, the load-lock chamber LL1 or the load-lock chamber LL2, and the transfer chamber 110, and subjected to the process in the process module of the transfer destination.

Figure 2:
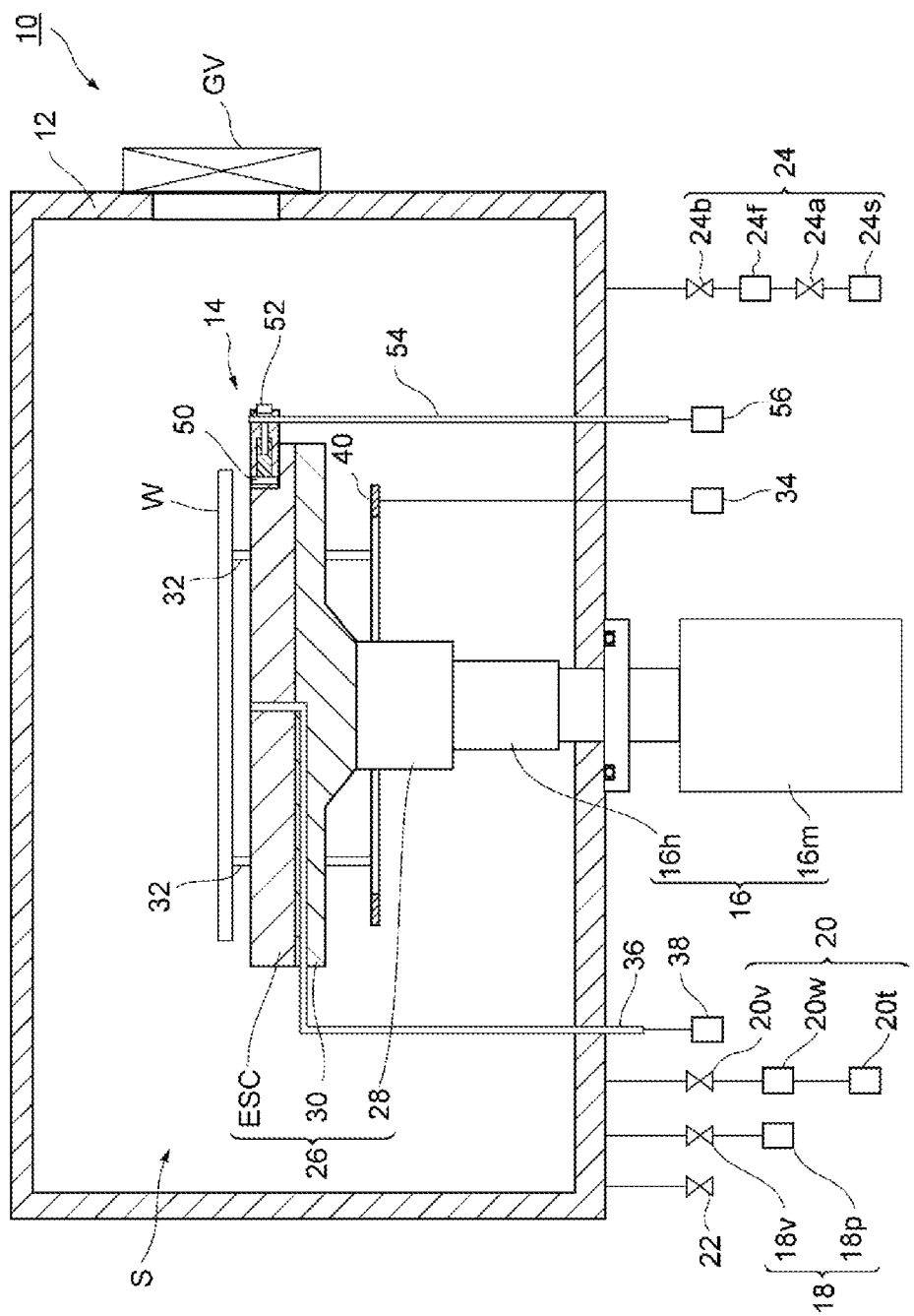
FIG. 2 is a view schematically illustrating a cooling treatment apparatus according to an exemplary embodiment.

The processing system 100 illustrated in FIG. 1 includes a cooling treatment apparatus related to the exemplary embodiment as a single process module or two or more process modules among the plurality of process modules PMs. FIG. 2 is a view schematically illustrating a cooling treatment apparatus according to an exemplary embodiment. In FIG. 2, a vertical cross-sectional structure of the cooling treatment apparatus 10 related to the exemplary embodiment is schematically illustrated.

The cooling treatment apparatus 10 illustrated in FIG. 2 includes a processing container 12, an electrostatic attraction apparatus 14, and a refrigerator 16. The processing container 12 has a substantially cylindrical shape and provides a space S therein. An opening for carry-in/carry-out of the wafer W to/from the space S is formed in the processing container 12 and the opening is configured to be opened/closed by a gate valve GV.

The cooling treatment apparatus 10 may further include a first depressurization unit 18, a second depressurization unit 20, a valve 22, and a gas supply unit 24. The first depressurization unit 18 is connected to the processing container 12 in order to depressurize the space S. The first depressurization unit 18 includes a vacuum pump 18p and a valve 18v. The vacuum pump 18p is connected to the processing container 12 through the valve 18v.

The second depressurization unit 20 is connected to the processing container 12. The second depressurization unit 20 is provided to cause the pressure within the space S to reach a pressure lower than the pressure capable of being reached by the first depressurization unit 18. That is, when the space S is depressurized in a state where the pressure within the space S is under the atmospheric pressure state, the cooling treatment apparatus 10 may operate the first depressurization unit 18 and then the second depressurization unit 20. In the exemplary embodiment, the second depressurization unit 20 includes a turbo molecular pump 20t, a water pump 20w, and a valve 20v.

The valve 22 is a valve configured to be opened when the pressure of the space S inside of the processing container 12 is set to the atmospheric pressure. The valve 22 is opened, for example, during the maintenance of the treatment apparatus 10.

The gas supply unit 24 is provided so as to supply a gas into the processing container 12. The gas supply unit 24 supplies the gas, for example, when the wafer W is cooled by the cooling treatment apparatus 10. The gas supply unit 24 may supply a noble gas such as, for example, Ar gas. Therefore, the gas supply unit 24 includes a gas source 24s, a valve 24a, a flow rate controller 24f such as, for example, a mass flow controller, and a valve 24b. The gas source 24s is connected to the processing container 12 through the valve 24a, the flow rate controller 24f, and the valve 24b.

As illustrated in FIG. 2, the electrostatic chuck ESC which is a part of the electrostatic attraction apparatus 14 is accommodated within the processing container 12. The electrostatic chuck ESC attracts and holds the wafer W mounted on the upper surface thereof by an electrostatic force. In the embodiment, the electrostatic chuck ESC constitutes a pedestal 26 together with the first support unit 28 and the second support unit 30. The first support unit 28 has substantially a columnar shape and is made of a high thermal conductivity material such as, for example, copper (Cu). The second support unit 30 is provided on the first support unit 28. The second support unit 30 is also made of a high thermal conductivity material such as, for example, copper (Cu). As an example, the second support unit 30 has an upper side portion having substantially disc shape and a lower side portion having a horizontal cross-sectional area which becomes gradually smaller toward the lower side. The electrostatic chuck ESC is provided on the second support unit 30.

The pedestal 26 is provided on the refrigerator 16. The refrigerator 16 includes a cooling head 16h and a body part 16m. The cooling head 16h provides a cooling surface which is in contact with the first support unit 28. The body part 16m cools the cooling head 16h by Gifford-McMahon cycle (G-M cycle) using a gas such as, for example, helium (He). The refrigerator 16 has a cooling capability of cooling the wafer W mounted on the electrostatic chuck ESC to a temperature ranging from −263° C. to −60° C. The lower limit value of the temperature in the range is a temperature obtained by adding a temperature increment (e.g., 2° C.) in the wafer W to the lower limit cooling temperature of the refrigerator 16 itself. Further, the upper limit value (−60° C.) of the temperature in the range is a temperature lower than the lower limit temperature capable of being obtained using a general refrigerant such as, for example, GALDEN (registered trademark). When the adhesive and the vacuum seal are utilized at a portion cooled to a temperature equal to or less than the upper limit value temperature, the adhesive and the vacuum seal may be embrittled. In the meantime, the refrigerator 16 is not limited to a refrigerator that utilizes the G-M cycle as long as the refrigerator 16 may cool the wafer W to the temperature within the temperature range described above.

Further, as illustrated in FIG. 2, the cooling treatment apparatus 10 further includes a lifter pin 32, a drive apparatus 34, a gas line (for a backside gas) 36, and a backside gas supply unit (for the backside gas) 38. As an example, the cooling treatment apparatus 10 includes three lifter pins 32 which are inserted into the holes penetrating through the pedestal 26 in the vertical direction. Further, the three lifter pins 32 are disposed at substantially regular intervals in a circumferential direction around the center of the pedestal 26. The lifter pins 32 are connected to the drive apparatus 34 through the link 40. The drive apparatus 34 moves the lifter pin 32 vertically. The lifter pins 32 move upward when the wafer W is carried into/carried out from the processing container 12. Accordingly, the tips of the lifter pins 32 are in a state of protruding above the electrostatic chuck ESC. In this state, the wafer W is delivered to the tips of the lifter pins 32 from the transfer unit TU2 described above. Otherwise, the wafer W supported on the tips of the lifter pins 32 is received by the transfer unit TU2. In the meantime, when the lifter pins 32 move downward, the wafer W supported on the tips of the lifter pins 32 is mounted on the upper surface of the electrostatic chuck ESC.

The gas line 36 extends into the processing container 12 from the outside of the processing container 12 and passes through the inside of the pedestal 26 from the side surface of the pedestal 26 to extend to the upper surface of the electrostatic chuck ESC. The gas line 36 is connected to the gas supply unit 38. The gas supply unit 38 supplies a backside gas for heat transfer, for example, He gas to the gas line 36. The gas supplied to the gas line 36 is supplied to the upper surface of the electrostatic chuck ESC, that is, a space between the second insulating layer and the wafer W.

Figure 3:
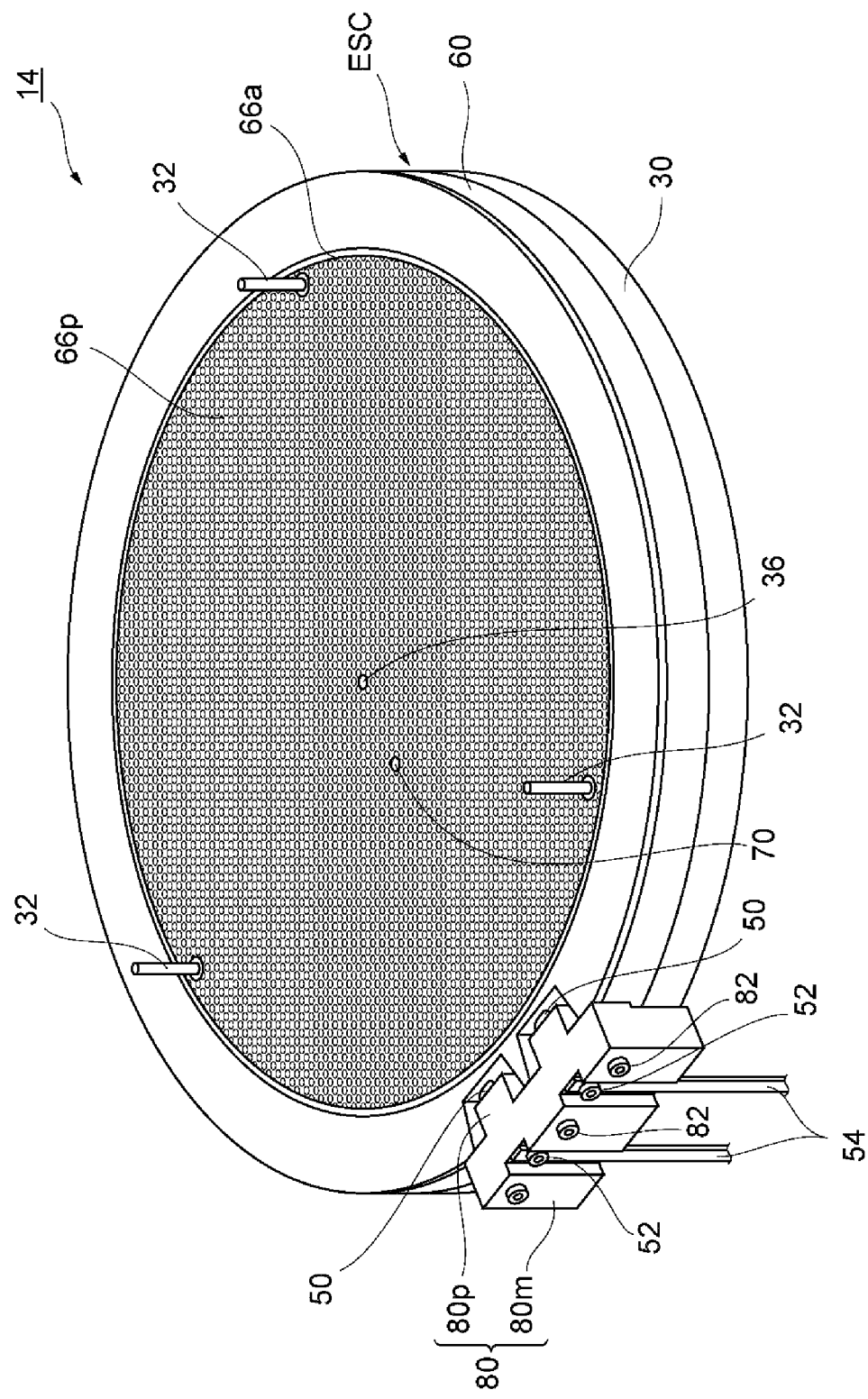
FIG. 3 is a perspective view illustrating an electrostatic attraction apparatus according to an exemplary embodiment.
Figure 4:
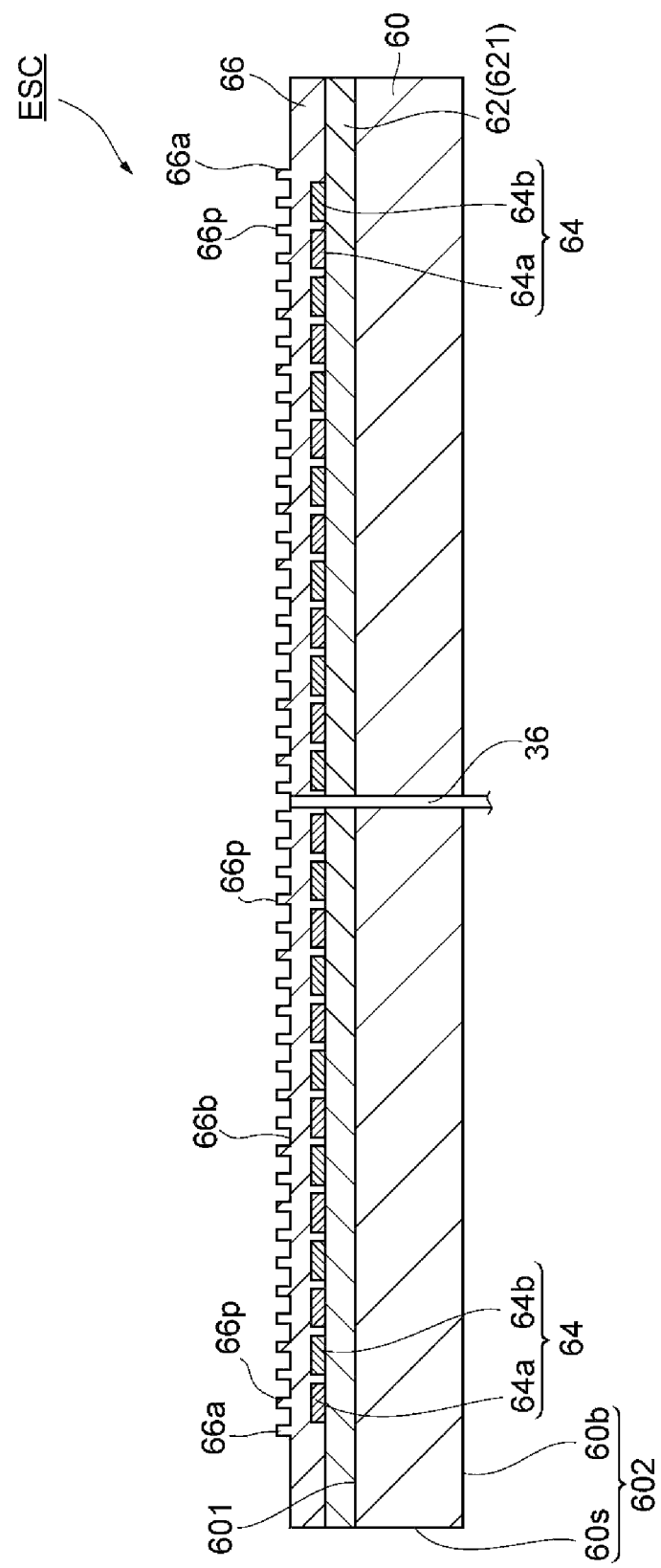
FIG. 4 is a cross-sectional view illustrating an electrostatic chuck according to an exemplary embodiment.

Hereinafter, descriptions will be made on the electrostatic attraction apparatus 14 of the exemplary embodiment in detail with reference to FIGS. 3, 4, 5, and 6 together with FIG. 2. FIG. 3 is a perspective view illustrating an electrostatic attraction apparatus according to an exemplary embodiment. FIG. 4 is a cross-sectional view illustrating an electrostatic chuck according to an exemplary embodiment.

Figure 5:
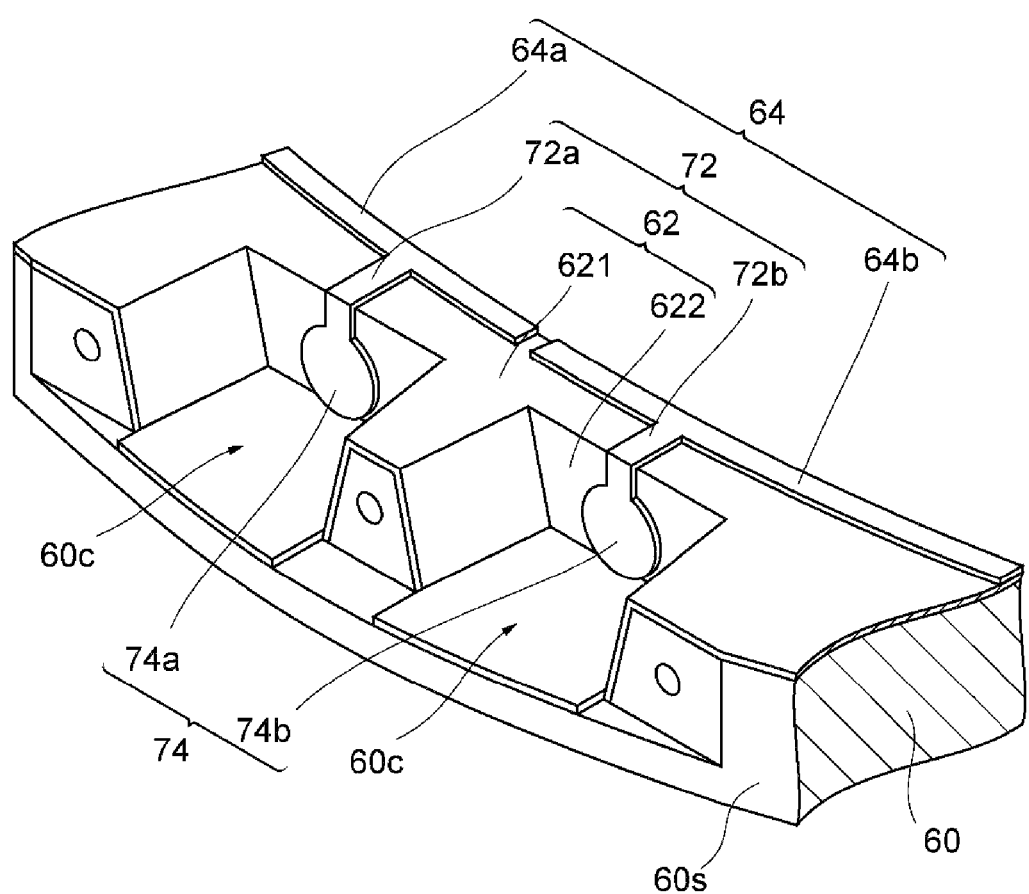
FIG. 5 is a perspective view illustrating some regions including a power supplying terminal of the electrostatic chuck according to the exemplary embodiment in an enlarged scale.
Figure 6:
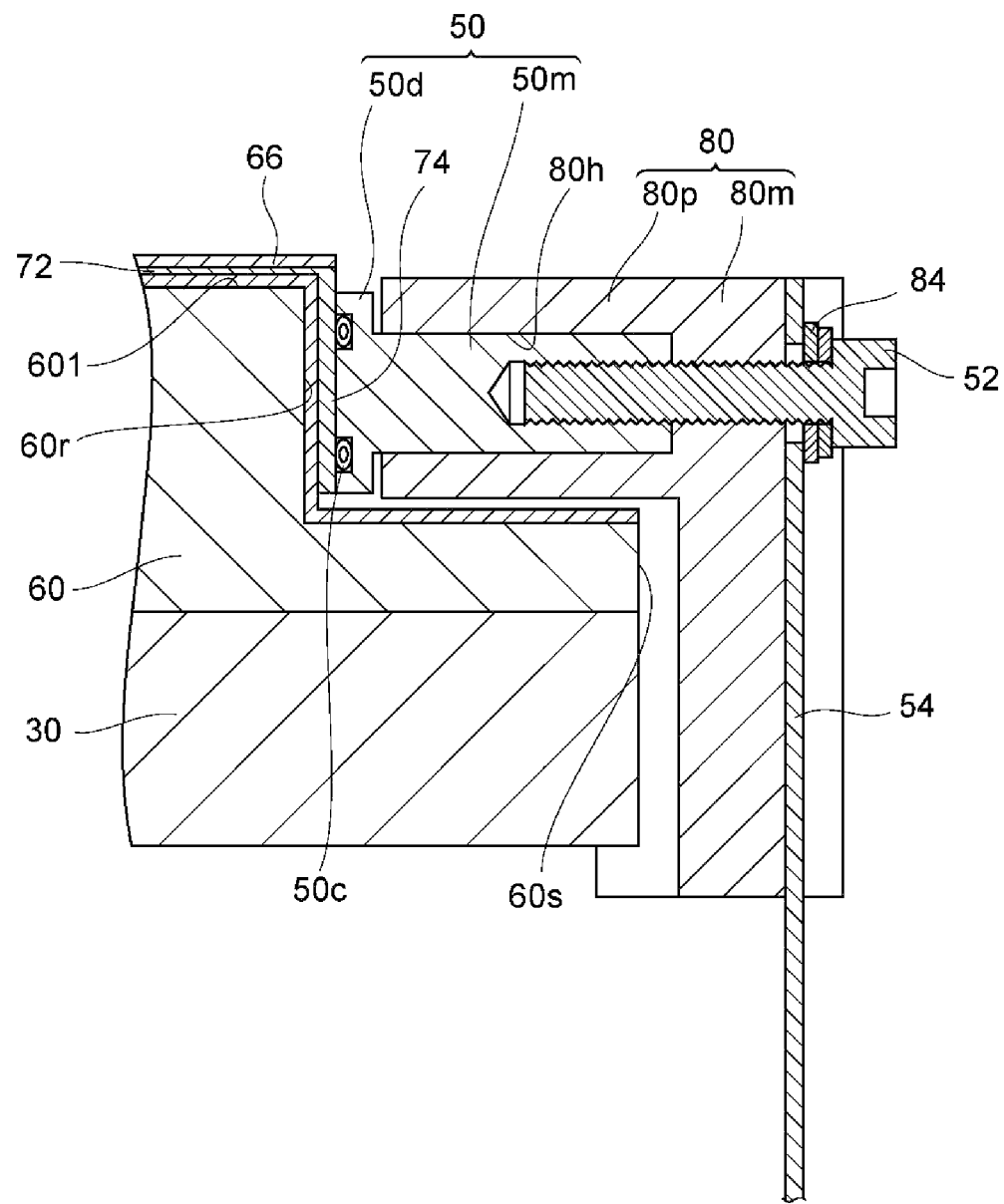
FIG. 6 is a cross-sectional view illustrating a portion of the electrostatic attraction apparatus according to the exemplary embodiment in an enlarged scale.

FIG. 5 is a perspective view illustrating some regions including a power supplying terminal of the electrostatic chuck according to an exemplary embodiment in an enlarged scale. In FIG. 5, a second insulating layer to be described later is omitted. FIG. 6 is a cross-sectional view illustrating a portion of the electrostatic attraction apparatus according to an exemplary embodiment in an enlarged scale and illustrates a portion related to the electrical connection between the power supplying terminal and the wiring line.

As illustrated in FIGS. 2 and 3, the electrostatic attraction apparatus 14 includes the electrostatic chuck ESC, a terminal member 50, an urging unit 52, a wiring line 54, and a power supply 56. The electrostatic chuck ESC includes a base 60, a first insulating layer 62, an attraction electrode 64, and a second insulating layer 66 as illustrated in FIGS. 3 and 4.

The base 60 is typically made of a metal such as, for example, copper (Cu) or aluminum (Al) and has substantially a disc shape. In the meantime, the base 60 may be made of, for example, ceramics other than a metal. As illustrated in FIG. 4, the base 60 includes a first face 601 and a second face 602 as its surface. The first face 601 is the upper surface of the base 60, and has substantially a circular flat shape. The second face 602 is the surface of the base 60 other than the first face 601 and in one example, includes a side surface 60s and a lower surface 60b of the base 60. In the meantime, the side surface 60s extends in a direction crossing with or orthogonal to the first face 601, and the lower surface 60b is opposite to the first face 601.

The first insulating layer 62 is formed on the base 60. The first insulating layer 62 is made of an insulating material such as, for example, alumina ($Al_2O_3$) or aluminum nitride (AlN). The first insulating layer 62 may be formed by spraying the insulating material onto the base 60.

As illustrated in FIGS. 4 and 5, the first insulating layer 62 includes a first portion 621 and a second portion 622. The first portion 621 extends on the first face 601 of the base 60. The second portion 622 is continued from the first portion 621 to extend above a portion of the second face 602. In the meantime, details of the second portion 622 of the first insulating layer 62 will be described later.

The attraction electrode 64 is formed on the first portion 621 of the first insulating layer 62. That is, the attraction electrode 64 is formed on the first face 601 through the first portion 621 of the first insulating layer 62. In one example, the electrostatic chuck ESC is a bipolar type electrostatic chuck and the attraction electrode 64 includes a first electrode 64a and a second electrode 64b as illustrated in FIGS. 4 and 5. The first electrode 64a and the second electrode 64b extend spirally toward the central part of the electrostatic chuck ESC from the edge part of the electrostatic chuck ESC.

The second insulating layer 66 is formed to cover the first insulating layer 62, the first portion 621, and the attraction electrode 64. The second insulating layer 66 is made of, for example, alumina ($Al_2O_3$) or aluminum nitride (AlN). As illustrated in FIGS. 3 and 4, the upper surface of the second insulating layer 66 includes a bottom surface 66b, a protruding part 66a, and a plurality of protruding parts 66p. The protruding part 66a and the plurality of protruding parts 66p are formed to protrude upward from the bottom surface 66b. The protruding part 66a extends annularly in a circumferential direction around the center of the electrostatic chuck ESC. Further, the plurality of protruding parts 66p have substantially a columnar shape and are distributed within the region surrounded by the protruding parts 66a. The second insulating layer 66 having such a shape may be formed by spraying an insulating material onto the first portion 621 of the first insulating layer 62 and the attraction electrode 64 to form the first insulating layer and then performing blasting on the insulating layer.

When the wafer W is mounted on the electrostatic chuck ESC, the upper end of the protruding part 66a comes in contact with a rear surface of an edge region of the wafer W and the upper ends of the protruding parts 66p come in contact with the rear surface of the wafer W. When the wafer W is mounted on the electrostatic chuck ESC to be in contact with the upper end of the protruding part 66a and the upper end of the protruding part 66p, a space is formed between the bottom surface 66b of the second insulating layer 66 and the rear surface of wafer W. The back side gas is supplied from the gas line 36 illustrated in FIG. 3 into the space. Further, the gas supplied into the space is recovered through a gas line 70 provided through the pedestal 26.

In the exemplary embodiment, the side surface 60s of the base 60 defines a recess 60c as illustrated in FIGS. 5 and 6. The second portion 622 of the first insulating layer 62 extends on the surface of the base 60 which defines the recess 60c. Further, the surface defining the recess 60c of the base 60 includes a region 60r which is non-parallel to the first face 601, that is, extends in a direction crossing with or orthogonal to the first face 601. The region 60r is a surface which defines the recess 60c at the central side of the electrostatic chuck ESC in the embodiment.

A conductor pattern 72 electrically connected to the attraction electrode 64 extends on the second portion 622 of the first insulating layer 62 formed on the region 60r. The conductor pattern 72 provides a power supplying terminal 74 on the second portion 622 formed on the region 60r. In the embodiment, the conductor pattern 72 includes a first conductor pattern 72a and a second conductor pattern 72b. Further, the power supplying terminal 74 includes a first power supplying terminal 74a and a second power supplying terminal 74b. The first conductor pattern 72a is electrically connected to the first electrode 64a and provides the first power supplying terminal 74a on the second portion 622 formed on the region 60r. Further, the second conductor pattern 72b is electrically connected to the second electrode 64b and provides the second power supplying terminal 74b on the second portion 622 formed on the region 60r. The first power supplying terminal 74a and the second power supplying terminal 74b are electrically connected with each of two wiring lines 54 connected to the power supply 56, respectively. Voltages having different potentials are supplied to the first electrode 64a and the second electrode 64b from the power supply 56. Accordingly, the electrostatic chuck ESC generates an electrostatic force.

Hereinafter, descriptions will be made on a configuration for an electrical connection between the first power supplying terminal 74a and a wiring line 54 and a configuration for an electrical connection between the second power supplying terminal 74b and another wiring line 54. In the meantime, the configuration for the electrical connection between the first power supplying terminal 74a and the wiring line 54 is similar to the configuration for the electrical connection between the second power supplying terminal 74b and the wiring line 54. Accordingly, hereinafter, descriptions will be made on a configuration for an electrical connection between a single power supplying terminal denoted by a reference numeral "72" and a single wiring line 54.

As illustrated in FIGS. 3 and 6, the electrical connection between the power supplying terminals 74 and the wiring lines 54 is implemented by interposing the terminal members 50 between the power supplying terminals 74 and the wiring lines 54 and causing the terminal members 50 to physically come in contact with the power supplying terminals 74. Each terminal member 50 includes a main part 50m and a tip portion 50d. The main part 50m has substantially a columnar shape. A screw hole is formed in the main part 50m. The screw hole extends in a longitudinal direction of the main part 50m from one end of the main part 50m. The tip portion 50d is continued to the main part 50m at the other end of the main part 50m. The tip portion 50d has substantially a disc shape. The tip portion 50d is provided with a contact part 50c. In the exemplary embodiment, an annularly extending groove is formed in the tip portion 50d. A spring made of a conductor is accommodated in the groove. The spring is for example, a coil spring. The spring constitutes a contact part 50c of the exemplary embodiment and physically comes in contact with the power supplying terminal 74.

Further, the contact part 50c of each terminal member 50 is configured to urge the power supplying terminal 74 by the urging unit 52. In the exemplary embodiment, the urging unit 52 is the screw made of a conductor. The screw 52 is supported by an insulating support member 80. The support member 80 includes a main part 80m and protruding parts 80p. The main part 80m extends along the side surface 60s of the base 60 and the side surface of the second support unit 30. A through hole is formed in the main part 80m and the screw hole is formed in the base 60 to continuously extend to the through hole of the main part 80m. When a screw 82 is screwed in the screw hole, the support member 80 is fixed to the base 60.

Each protruding part 80p of the support member 80 extends to protrude from the main part 80m. The protruding part 80p of the support member 80 is inserted into the recess 60c of the base 60. The protruding part 80p provides a hole 80h, into which the main part 50m of the terminal member 50 is inserted. Further, a through hole is formed in the main part 80m of the support member 80 to be continued to the hole 80h. The screw 52 passes through the through hole to be screwed in the hole of the main part 50m of the terminal member 50 such that the contact part 50c is urged to the power supplying terminal 74.

Further, the wiring lines 54 are provided along the main part 80m of the support member 80 as illustrated in FIGS. 3 and 6. A hole through which the screw passes is formed in each wiring line 54 and the wiring line 54 is interposed between the main part 80m and a head of the screw 52. Accordingly, the wiring line 54 and the screw 52 are conductive with each other and the screw 52 and the terminal member 50 are conductive with each other. As a result, the electrical connection between the wiring line 54 and the power supplying terminal 74 is implemented. In the meantime, a washer 84 made of a conductor may be provided between the head of the screw 52 and the wiring line 54 in the exemplary embodiment.

As described above, in the electrostatic attraction apparatus 14 of the exemplary embodiment, the contact part 50c of the terminal member 50 is in contact with the power supplying terminal 74 and is urged to the power supplying terminal 74 by the screw (urging unit) 52. Accordingly, in the electrostatic attraction apparatus 14, the electrical connection between the power supplying terminal 74 and the wiring line 54 may be secured without requiring an adhesive and a vacuum seal for the portion related to the connection between the power supplying terminal 74 and the wiring line 54. Therefore, the connection reliability between the power supplying terminal 74 and the wiring line 54 may be secured even under an extremely low temperature environment. Further, in the electrostatic attraction apparatus 14, the power supplying terminal 74 is formed on the second portion 622 of the first insulating layer 62 formed on the second face 602 of the base 60. Accordingly, the electrostatic chuck ESC may be suppressed from being fractured by the pressure of the urging unit 52.

Further, in the exemplary embodiment, the urging unit is configured by a screw 52 which is supported by an insulating support member 80. An urging unit having a simple configuration may be implemented in the exemplary embodiment.

Further, in the exemplary embodiment, the contact part 50c of the terminal member 50 is configured by a conductive spring. According to the exemplary embodiment, the physical connection reliability between the contact part 50c of the terminal member 50 and the power supplying terminal 74 is further increased.

Hereinafter, descriptions will be made on an application example of the cooling treatment apparatus 10 and the processing system 100 provided with the cooling treatment apparatus 10 as a process. In the application example, the processing system 100 is used in manufacturing an MTJ (Magnetic Tunnel Junction) device constituting an MRAM (Magnetoresistive Random Access Memory).

Figure 7:
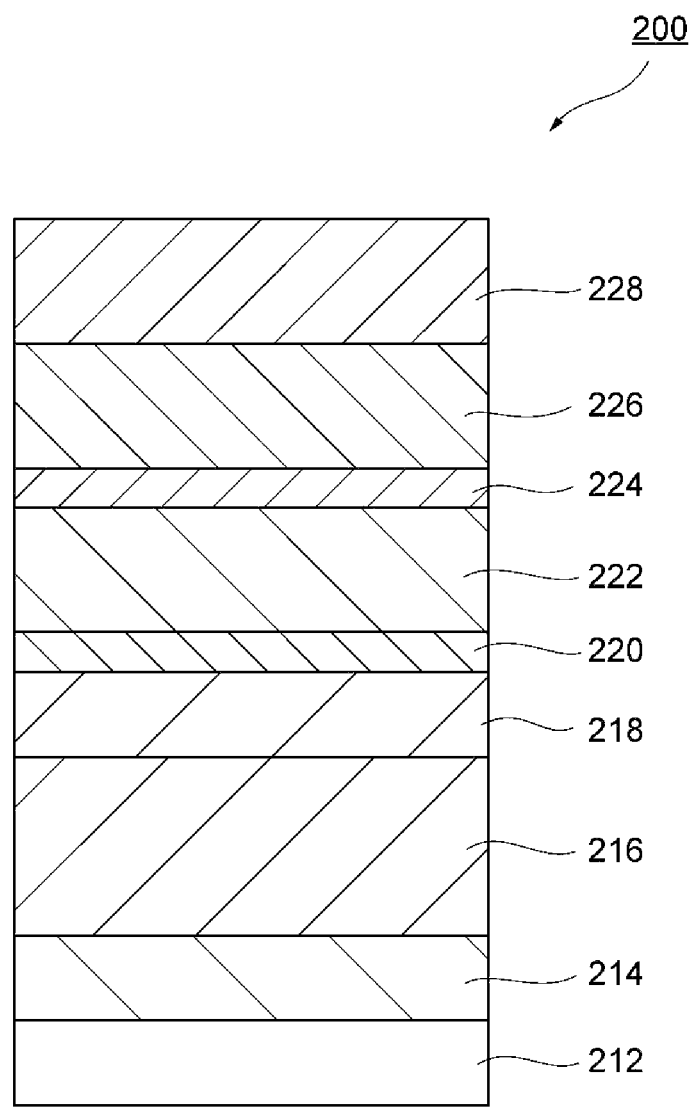
FIG. 7 is a cross-sectional view illustrating an exemplary MTJ element.

FIG. 7 is a cross-sectional view illustrating an MTJ element according to an example. An MTJ device 200 illustrated in FIG. 7 includes a first magnetic layer 222, a second magnetic layer 226, and a tunnel insulating layer 224. The tunnel insulating layer 224 is formed between the first magnetic layer 222 and the second magnetic layer 226. The first magnetic layer 222 and the second magnetic layer 226 may be a magnetic metal layer, for example, a Co—Fe—B layer. The tunnel insulating layer 224 may be a metal oxide layer, for example, a magnesium oxide layer, an aluminum oxide layer, and a titanium oxide layer.

The MTJ device 200 may further include a lower electrode layer 212, an underlayer 214, an anti-ferromagnetic layer 216, a magnetic layer 218, a magnetic layer 220, and a cap layer 228. The underlayer 214 is formed on the lower electrode layer 212. The anti-ferromagnetic layer 216 is formed on the underlayer 214. The magnetic layer 218 is formed on the anti-ferromagnetic layer 216. The magnetic layer 220 is formed on the magnetic layer 218. The first magnetic layer 222 is formed on the magnetic layer 220. The cap layer 228 is formed on the second magnetic layer 226. In the example, the lower electrode layer 212 is a Ru layer, the underlayer 214 is a Ta layer, the anti-ferromagnetic layer 216 is a Mn—Pt layer, and the magnetic layer 218 is a Co—Fe layer, the magnetic layer 220 is a Ru layer, and the cap layer 228 is a Ta layer.

The cooling treatment apparatus 10 may be used, for example, before or during the deposition of the second magnetic layer 226 of the MTJ device 200. When the wafer W on which the MTJ device 200 is formed is cooled using the cooling treatment apparatus 10 before or during the deposition of the second magnetic layer 226, which is the CoFeB layer, the second magnetic layer 226 having an excellent film quality may be formed. In the meantime, in a case where the cooling treatment apparatus 10 is utilized during the deposition, the cooling treatment apparatus 10 is configured as a physical vapor deposition apparatus. In this case, the cooling treatment apparatus 10 is further provided with a target, a target holder, a plasma generating electrode, and a power supply supplying an electrical power to the plasma generating electrode.

Although various exemplary embodiments has been described above, the present disclosure is not limited to the exemplary embodiments described above and various modifications may be made thereto. For example, the power supplying terminal 74 may be formed on other surface of the base 60 which is opposite to the first face 601 of the base 60. Further, the electrostatic chuck ESC of the exemplary embodiment is a bipolar electrostatic chuck, but may be a monopolar electrostatic chuck in a modified embodiment. Further, although the cooling treatment apparatus 10 is utilized mainly before or during the deposition of the second magnetic layer 226 in the application example described above, the cooling treatment apparatus 10 may be utilized before or during the deposition of other layer of the MTJ device 200, or in a manufacturing process of a device other than the MTJ device.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. An electrostatic attraction apparatus comprising:
    an electrostatic chuck configured to attract and hold a processing target object, the electrostatic chuck including:
        a base including a first face and a second face different from the first face,
        a first insulating layer formed on the base and including a first portion extending on the first face and a second portion extending on at least a portion of the second face,
        an attraction electrode formed on the first portion,
        a second insulating layer formed on the first portion and the attraction electrode, and
        a conductor pattern formed on the first insulating layer and electrically connected to the attraction electrode, the conductor pattern including a power supplying terminal formed on the second portion;
    a terminal member including a contact part contacted to the power supplying terminal;
    an urging unit configured to urge the contact part of the terminal member to the power supplying terminal;
    a wiring line electrically connected to the terminal member; and
    a power supply electrically connected to the wiring line.

2. The electrostatic attraction apparatus of claim 1, wherein the urging unit is a screw, and
    the apparatus further comprises an insulating support member configured to support the screw.

3. The electrostatic attraction apparatus of claim 1, wherein the contact part includes a conductive spring.

4. The electrostatic attraction apparatus of claim 1, wherein the wiring line is electrically connected to the terminal member through the urging unit.

5. The electrostatic attraction apparatus of claim 1, wherein the second face includes a region extending in a direction which is non-parallel to the first face, and the power supplying terminal is formed on the region of the second face through the second portion.

6. The electrostatic attraction apparatus of claim 1, wherein the processing target object is attracted and held at a temperature ranging from −263° C. to −60° C.

7. An electrostatic attraction chuck for attracting and holding a processing target object, the chuck comprising:
    a base including a first face and a second face different from the first face;

a first insulating layer formed on the base and including a first portion extending on the first face and a second portion extending on at least a portion of the second face;
an attraction electrode formed on the first portion;
a second insulating layer formed on the first portion and the attraction electrode; and
a conductor pattern formed on the first insulating layer and electrically connected to the attraction electrode, the conductor pattern including a power supplying terminal formed on the second portion.

8. A cooling treatment apparatus comprising:
a processing container;
the electrostatic attraction apparatus defined in claim 1, the electrostatic chuck being provided within the processing container; and
a refrigerator configured to cool the electrostatic chuck.

* * * * *